(12) United States Patent
Degani et al.

(10) Patent No.: US 10,788,794 B2
(45) Date of Patent: Sep. 29, 2020

(54) DTC BASED CARRIER SHIFT—ONLINE CALIBRATION

(71) Applicant: Intel Corporation, Santa Clara, CA (US)

(72) Inventors: Ofir Degani, Haifa (IL); Elan Banin, Raanana (IL); Eran Ben Ami, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/564,538

(22) Filed: Sep. 9, 2019

(65) Prior Publication Data

US 2020/0004207 A1    Jan. 2, 2020

Related U.S. Application Data

(63) Continuation of application No. 16/023,973, filed on Jun. 29, 2018, now Pat. No. 10,459,407.

(51) Int. Cl.
| | |
|---|---|
| *G04F 10/00* | (2006.01) |
| *H03L 7/099* | (2006.01) |
| *H03M 1/10* | (2006.01) |
| *H03M 1/84* | (2006.01) |
| *H03M 1/18* | (2006.01) |

(52) U.S. Cl.
CPC .......... *G04F 10/005* (2013.01); *H03L 7/0991* (2013.01); *H03M 1/1009* (2013.01); *H03M 1/84* (2013.01); *H03M 1/1028* (2013.01); *H03M 1/18* (2013.01)

(58) Field of Classification Search
CPC ..... G04F 10/005; H03M 1/84; H03M 1/1009; H03M 1/18; H03L 7/0991
USPC .................................................. 341/166, 144
See application file for complete search history.

(56) References Cited

U.S. PATENT DOCUMENTS

| | | | |
|---|---|---|---|
| 8,462,840 B2 | 6/2013 | Chen et al. | |
| 9,137,084 B2 | 9/2015 | Degani et al. | |
| 9,209,958 B1 * | 12/2015 | Palaskas | ............... H04B 17/14 |

(Continued)

OTHER PUBLICATIONS

Ru, Jiayoon Zhiyu et al. "A High-Linearity Digital-to-Time Converter Technique: Constant-Slope Charging." 35 pages.

(Continued)

*Primary Examiner* — Brian K Young
(74) *Attorney, Agent, or Firm* — Viering, Jentschura & Partner MBB

(57) ABSTRACT

A digital to time converter (DTC) system is disclosed. The DTC system comprises a DTC circuit configured to generate a DTC output clock signal at a DTC output frequency, based on a DTC code. In some embodiments, the DTC system further comprises a calibration circuit comprising a period error determination circuit configured to determine a plurality of period errors respectively associated with a plurality consecutive edges of the DTC output clock signal. In some embodiments, each period error of the plurality of period errors comprises a difference in a measured time period between two consecutive edges of the DTC output clock signal from a predefined time period. In some embodiments, the calibration circuit further comprises an integral non-linearity (INL) correction circuit configured to determine a correction to be applied to the DTC code based on a subset of the determined period errors.

18 Claims, 5 Drawing Sheets

(56) References Cited

U.S. PATENT DOCUMENTS

| | | |
|---|---|---|
| 9,520,890 B1 | 12/2016 | Ben-Bassat et al. |
| 9,577,684 B1 | 2/2017 | Zur et al. |
| 9,705,613 B2 * | 7/2017 | Ravi ..................... H04B 17/21 |
| 9,791,834 B1 * | 10/2017 | Nassar .................... G04G 5/00 |
| 10,459,407 B1 * | 10/2019 | Degani ............... H03M 1/1014 |
| 2014/0266822 A1 | 9/2014 | Henzler et al. |
| 2015/0188583 A1 | 7/2015 | Ravi et al. |
| 2017/0085365 A1 | 3/2017 | Ravi et al. |

OTHER PUBLICATIONS

"Pushing and Pulling." http://www.ittc.ku.edu/~jstiles/622/handouts/old handouts/Pushing and Pulling.pdf. Oct. 4, 2002. 5 pages.
Notice of Allowance dated Jun. 10, 2019 for U.S. Appl. No. 16/023,973.
Non-Final Office Action dated Mar. 1, 2019 for U.S. Appl. No. 16/023,973.
Choi, Yong-Chang et al. "A Fully-Digital Phase Modulator with Phase Calibration Loop for High Data-Rate Systems." ISOCC 2017.
International Search Report dated Aug. 26, 2019 for International Application No. PCT/US2019/034317.

\* cited by examiner

DTC BASED CARRIER SHIFT—ONLINE CALIBRATION

REFERENCE TO RELATED APPLICATION

This application is a continuation of U.S. application Ser. No. 16/023,973 filed on Jun. 29, 2018, the contents of which are incorporated by reference in their entirety.

FIELD

The present disclosure relates to the field of digital to time converter (DTC) systems, and in particular, to a method and an apparatus for calibration of DTC circuits.

BACKGROUND

Looking forward on cellular & connectivity convergence, a single transceiver would include multiple phase locked loops (PLLs) generating, simultaneously, different frequencies. In some embodiments, using multiple PLLs to generate different frequencies results in large area, high power and mutual frequency pulling. In order to generate different frequencies, in some embodiments, the multiple PLLs are replaced by a single PLL and multiple digital to time converters (DTCs). DTCs are important building blocks in communication systems. A DTC is a building block which delays incoming signal edges according to a digital code at its input. A DTC can offset frequency by adding a linear phase ramp. In some embodiments, replacing multiple PLLs with a single-PLL and multiple DTCs facilitates to generate multiple frequencies at the same time, which results in major area reduction, and power reduction. Moreover, utilizing DTCs enables fast change of LO frequency as DTC output frequency can be modified instantaneously. However, any non-linearity in the DTC can cause spurs and can affect the performance of the DTCs.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
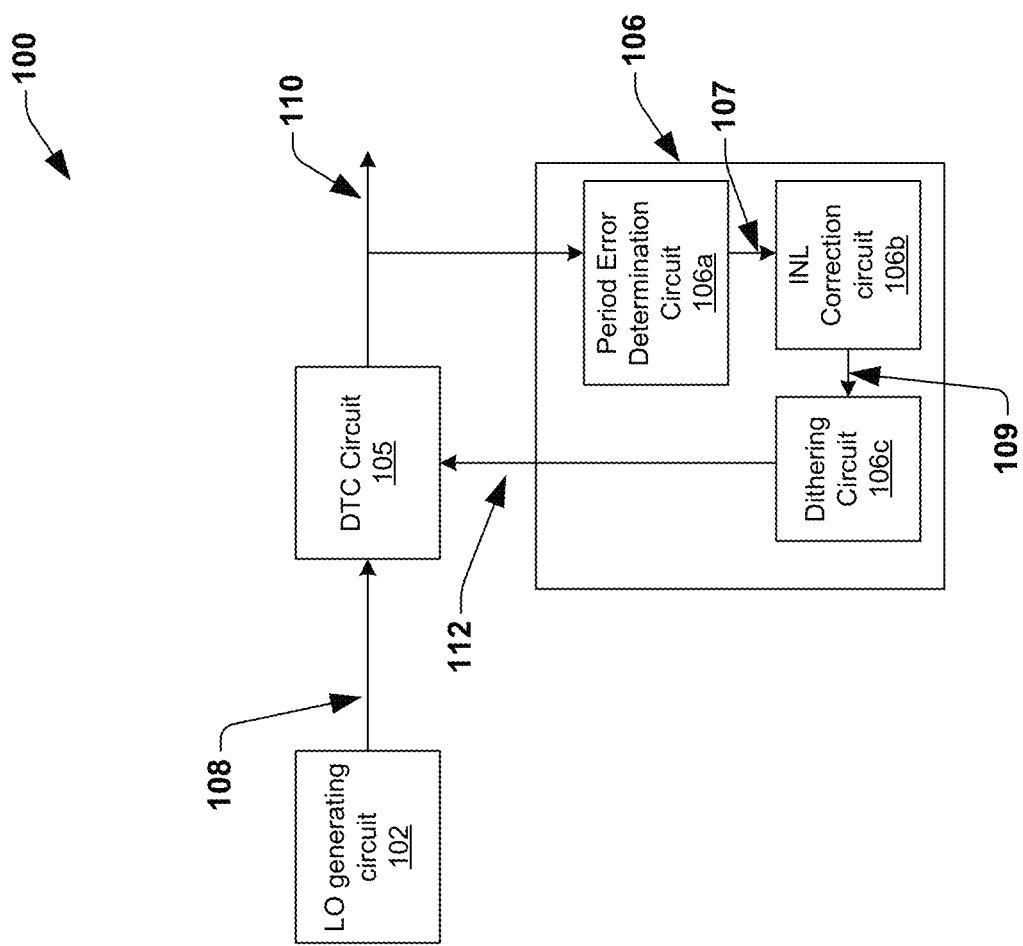
FIG. 1 illustrates a simplified block diagram of a digital to time converter (DTC) system, according to one embodiment of the disclosure.

In one embodiment of the disclosure, a digital to time converter (DTC) system is disclosed. The DTC system comprises a DTC circuit configured to generate a DTC output clock signal at a DTC output frequency, based on a DTC code. In some embodiments the DTC system further comprises a calibration circuit comprising a period error determination circuit configured to determine a plurality of period errors respectively associated with a plurality consecutive edges of the DTC output clock signal, wherein each period error of the plurality of period errors comprises a difference in a measured time period between two consecutive edges of the DTC output clock signal from a predefined time period. In some embodiments, the calibration circuit further comprises an integral non-linearity (INL) correction circuit configured to determine a correction to be applied to the DTC code based on a subset of the determined period errors.

In one embodiment of the disclosure, a method for a digital to time converter (DTC) system is disclosed. The method comprises generating a DTC output clock signal at a DTC output frequency, based on a DTC code, at a DTC circuit. In some embodiments, the method further comprises determining a plurality of period errors respectively associated with a plurality consecutive edges of the DTC output clock signal, at a period error determination circuit, wherein each period error of the plurality of period errors comprises a difference in a measured time period between two consecutive edges of the DTC output clock signal from a predefined time period. The method further comprises determining a correction to be applied to the DTC code based on a subset of the determined period errors, at an integral non-linearity (INL) correction circuit.

In one embodiment of the disclosure, a transceiver circuit, comprising a transmit path configured to provide a transmit signal at a transmit frequency for subsequent transmission is disclosed. The transmit path comprises a mixer circuit configured to upconvert an input signal to the transmit signal at the transmit frequency, based on a digital to time converter (DTC) output clock signal; and a DTC circuit coupled to the mixer circuit and configured to generate the DTC output clock signal at a DTC output frequency, based on a DTC code. In some embodiments, the transmit path further comprises a calibration circuit, comprising a period error determination circuit configured to determine a plurality of period errors respectively associated with a plurality consecutive edges of the DTC output clock signal. In some embodiments, each period error of the plurality of period errors comprises a difference in a measured time period between two consecutive edges of the DTC output clock signal from a predefined time period. In some embodiments, the transmit path further comprises an integral non-linearity (INL) correction circuit configured to determine a correction to be applied to the DTC code based on a subset of the determined period errors.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from conte8, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from conte8 to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, DTCs are important building blocks in communication systems. A DTC is a building block which delays incoming signal edges according to a digital code at its input. In other words, the delay provided by the DTC to incoming signal edges can be tuned based on the digital code. If delay tuning is linear, a high-linearity DTC can be realized. A linear DTC is favored, as calibration of only two points is sufficient, in contrast to a non-linear DTC that require multi-point calibration. To characterize linearity, integral nonlinearity (INL) is an important metric for a DTC. Non-zero DTC INL causes spurs and affects the performance of the DTCs. Therefore, it is important to calibrate the DTC in order to compensate for the INL associated with the DTC. In current implementations of DTC systems, DTCs are calibrated based on a single INL-lookup table (LUT) for all frequencies. In some applications, mixer requirement for out-of-band spurs is −100 dBc. This means sub-LSB accuracy of ~10 fs. However, calibrating a DTC based on a single INL-LUT is not enough for achieving such high accuracies, as a change in the code-ramp can slightly change the INL due to dynamic effect. Further, temperature can also change the INL. In other implementations, for example, in digital transmitters, a DTC is calibrated based on measuring the DTC phase offset directly. In other words, a delay associated with each code is measured based on measuring a time difference between an input and output of the DTC. However, this technique requires a large time to digital converter (TDC) with huge-dynamic range in order to measure the phase offset.

Therefore, in order to overcome the above disadvantages, an apparatus and a method to calibrate the DTC based on measuring a time period at the output of the DTC is proposed in this disclosure. In particular, an apparatus and a method to calibrate a DTC based on measuring a period error between two consecutive edges of the DTC output signal is proposed. In some embodiments, the period error between two consecutive edges of the DTC output signal comprises a difference in a measured time period between two consecutive edges of the DTC output clock signal from a predefined time period. In some embodiments, the predefined time period comprises a required/expected time period between the two consecutive edges. In some embodiments, utilizing the period error at the output of the DTC output signal to calibrate the DTC enables to utilize a very small purely stochastic time to digital converter (TDC) with a low dynamic range in the calibration setup.

FIG. 1 illustrates a simplified block diagram of a digital to time converter (DTC) system 100, according to one embodiment of the disclosure. In some embodiments, the DTC system 100 could be part of transceivers in communication devices. The DTC system 100 comprises a local oscillator (LO) generating circuit 102 configured to generate a LO signal 108 at a LO frequency $F_{LO}$. In some embodiments, the LO generating circuit 102 comprises a phase locked loop (PLL). The DTC system 100 further comprises a DTC circuit 105 configured to receive the LO signal 108 and generate a DTC output clock signal 110 based thereon, in accordance with a DTC code 112. In some embodiments, the DTC output clock signal 110 comprises a DTC output frequency Fc. In this embodiment, the DTC system 100 is shown to include a single DTC circuit 105. However, in other embodiments, the DTC system 100 can comprise a plurality of DTC circuits, each configured to receive the LO signal 108 and generate respective DTC output clock signals at different frequencies.

In some embodiments, the DTC code 112 comprises a digital code that defines a delay associated with the various edges of the DTC output clock signal 110. In some embodiments, the DTC code 112 is implemented as a DTC code ramp that repeats itself. In some embodiments, the DTC code ramp comprises a set of codes that corresponds respectively to a set of consecutive edges of the DTC output clock signal 110. In some embodiments, the DTC circuit 105 may be non-linear. In some embodiments, a linearity of the DTC circuit 105 is characterized based on a metric defined as integral nonlinearity (INL). Non-zero INL causes spurs and affects the performance of the DTCs (e.g., the DTC circuit 105). For example, if the DTC circuit 105 has a non-zero INL, a specific code associated with the DTC code 112 may not give a required phase shift to a respective edge, thereby affecting the phase of the DTC output clock signal 110 resulting in spurs. Therefore, it is important to calibrate the DTC circuit 105 in order to compensate for the INL associated with the DTC 105.

In some embodiments, the DTC system 100 further comprises a calibration circuit 106 configured to compensate for the INL associated with the DTC circuit 105. In some embodiments, the calibration circuit 106 is configured to compensate for the INL by applying a correction to the DTC code 112 based on measuring a time period between consecutive edges of the DTC output clock signal. In particular, in some embodiments, the calibration circuit 106 is configured to determine a period error between the consecutive edges, in order to apply the correction to the DTC code 112 (or the DTC code ramp associated therewith). In some embodiments, the period error between two consecutive edges of the DTC output signal 110 comprises a difference in a measured time period between two consecutive edges of the DTC output clock signal 110 from a predefined time period. In some embodiments, the measured time period refers to the time period between the two consecutive edges of the DTC output clock signal 110 at a current instance. In some embodiments, the predefined time period comprises a required/expected time period between the two consecutive edges. However, in other embodiments, the predefined time period may be different from the required/expected time period between the two consecutive edges. In some embodiments, the predefined time period is chosen to be close to the required/expected time period, so as to have a small value for the period error.

In some embodiments, the consecutive edges can comprise two consecutive rising edges associated with the DTC output clock signal 110. Alternately, in other embodiments, the consecutive edges can comprise one rising edge and one falling edge associated with the DTC output clock signal 110. In some embodiments, the calibration circuit 106 comprises a period error determination circuit 106a, in order to measure the period error 107 between the consecutive edges. In some embodiments, the period error determination circuit may be implemented as a time to digital converter (TDC) circuit. However, other implementations of the period error determination circuit are also contemplated to be within the scope of this disclosure. In some embodiments, measuring the period error between the consecutive edges rather than directly measuring the time period between the consecutive edges, enables to utilize a very small purely stochastic TDC with no delay elements. In some embodiments, utilizing a small TDC enables to reduce power consumption and the area used. In some embodiments, the predefined time period utilized in determining the period error is chosen in such a way that the determined period error is small, for example, within the dynamic range of the small stochastic TDC.

In some embodiments, the period error determination circuit 106a is configured to determine a plurality of period errors 107 respectively associated with a plurality consecutive edges of the DTC output clock signal 110, in order to determine the correction to be applied to the DTC code 112. In some embodiments, the calibration circuit 106 further comprises an INL correction circuit 106b configured to store the DTC code 112 associated with the DTC circuit 105 in a memory circuit associated therewith and is configured to provide the DTC code 112 to the DTC circuit 105. In some embodiments, the INL correction circuit 106b is further configured to determine a correction to be applied to the DTC code 112 based on a subset of the determined period errors (determined at the period error determination circuit 106a). In some embodiments, a number of period errors in the subset of the determined period errors is less than a number of period errors in the plurality of determined period errors (determined at the period error determination circuit 106a). In some embodiments, determining the correction to be applied to the DTC code 112 at the INL correction circuit 106b comprises determining that no correction is to be applied to the DTC code 112 when all the period errors in the subset of the determined period errors are equal, and determining a specific correction associated with one or more codes associated with the DTC code 112, when all the period errors in the subset of the determined period errors are not equal. In some embodiments, equal period errors indicate that the time period between the corresponding consecutive edges are equal, which further indicates a zero INL.

Upon determining the correction to be applied to the DTC code 112, in some embodiments, the INL correction circuit 106b is further configured to apply the determined correction to the DTC code 112 stored within the memory circuit and provide the DTC code 112 to the DTC circuit 105. In some embodiments, if all the period errors in the subset of the determined period errors are equal, the INL correction circuit 106b is configured to apply no correction to the DTC code 112. However, if not all the period errors in the subset of the determined period errors are equal, the INL correction circuit 106b is configured to apply the specific correction to the DTC code 112. In some embodiments, the output of the INL correction circuit 106b comprises a code ramp 109. In some embodiments, therefore, the code ramp 109 at the output of the INL correction circuit 106b may comprise an updated DTC code 112, while in other embodiments, the DTC code 112 at the output of the calibration circuit 106 may comprise the same DTC code 112 as before. In some embodiments, the calibration circuit 106 further comprises a dithering circuit 106c configured to apply dithering to the DTC code 109 at the output of the INL correction circuit 106b, prior to providing the DTC code 112 to the DTC circuit 105. In some embodiments, the DTC code 112 at the output of the dithering circuit 106c is a dithered version of the DTC code 109 at the output of the INL correction circuit 106b. In some embodiments, the INL correction circuit 106b is further configured to repeatedly determine the correction to be applied to the DTC code 112 respectively based on repeated subsets of the determined period errors. In some embodiments, a correction is applied to the DTC code 112 by adjusting one or more codes associated with the DTC code ramp based on the period errors associated with the edges associated with the corresponding one or more codes. Thus, in some embodiments, the DTC code 112 to be provided to the DTC circuit 105 is selectively updated depending on the correction to the DTC code 112 determined within the INL correction circuit 106b during the different repetitions.

In some embodiments, the subset of determined period errors utilized to determine the correction to the DTC code 112 corresponds to a set of period errors respectively associated with a set of consecutive edges corresponding to a set of codes associated with a single DTC code ramp. For example, if a single DTC code ramp has 10 codes (e.g., 0, 100, 200 . . . 900) corresponding to 10 consecutive edges of the DTC output signal 110, then the INL correction circuit 106b may be configured to determine the correction to be applied to the DTC code 112 (or the DTC code ramp) based on 10 period errors respectively associated with the 10 consecutive edges. In such embodiments, the INL correction circuit 106b is configured to correct the DTC code 112 if all the 10 period errors are not equal. However, if all the 10 period errors are equal, no correction is applied to the DTC code 112 and same DTC code 112 is used. The correction to be applied to the DTC code 112 may be determined differently in different embodiments. For example, in some embodiments, if the period error between the edges corresponding to codes 100 and 200 is different from the other 9 period errors, a correction may be applied to the 100th code or the 200th code, based on the corresponding period error. Alternately, in other embodiments, if the period error between the edges corresponding to codes 100 and 200 is different from the other 9 period errors, a small correction may be applied to all the codes associated with the DTC code ramp, based on the corresponding period error. However, in other embodiments, the correction to be applied to the DTC code 112 may be determined differently.

In some alternate embodiments, the subset of determined period errors utilized to determine the correction to the DTC code 112 corresponds to period errors associated with consecutive edges corresponding to multiple set of codes respectively associated with multiple DTC code ramps. In some embodiments, determining the period errors associated with a particular code over multiple code ramps enables to determine an average period error associated with a specific code. For example, if a single DTC code ramp has 10 codes (e.g., 0, 100, 200 . . . 900) corresponding to 10 consecutive edges of the DTC output signal 110, then the INL correction circuit 106b may be configured to determine the correction to be applied to the DTC code 112 (or the DTC code ramp) based on 1000 period errors respectively associated with the 1000 consecutive edges of the DTC output clock signal 110. Therefore, in such embodiments, each code will have 100 period errors associated therewith and the correction to a specific code associated with the DTC code ramp can be determined at the INL correction circuit 106b based on averaging the plurality of period errors (for example, 100 in this case) associated with the specific code.

Upon determining the average period error associated with each code of the code ramp (for example, 10 in this case), the INL correction circuit 106b is configured to correct the DTC code 112 if all the 10 averaged period errors are not equal. However, if all the 10 averaged period errors are equal, no correction is applied to the DTC code 112 and same DTC code 112 is used. Further, as indicated above, the correction to be applied to the DTC code 112 may be determined differently in different embodiments. For example, in some embodiments, if the averaged period error between the edges corresponding to codes 100 and 200 is different from the other 9 averaged period errors, a correction may be applied to the 100th code or the 200th code, based on the corresponding averaged period error. Alternately, in other embodiments, if the averaged period error between the edges corresponding to codes 100 and 200 is different from the other 9 averaged period errors, a small correction may be applied to all the codes associated with the DTC code ramp, based on the corresponding averaged period error. However, in other embodiments, the correction to be applied to the DTC code 112 may be determined differently.

Figure 2A:
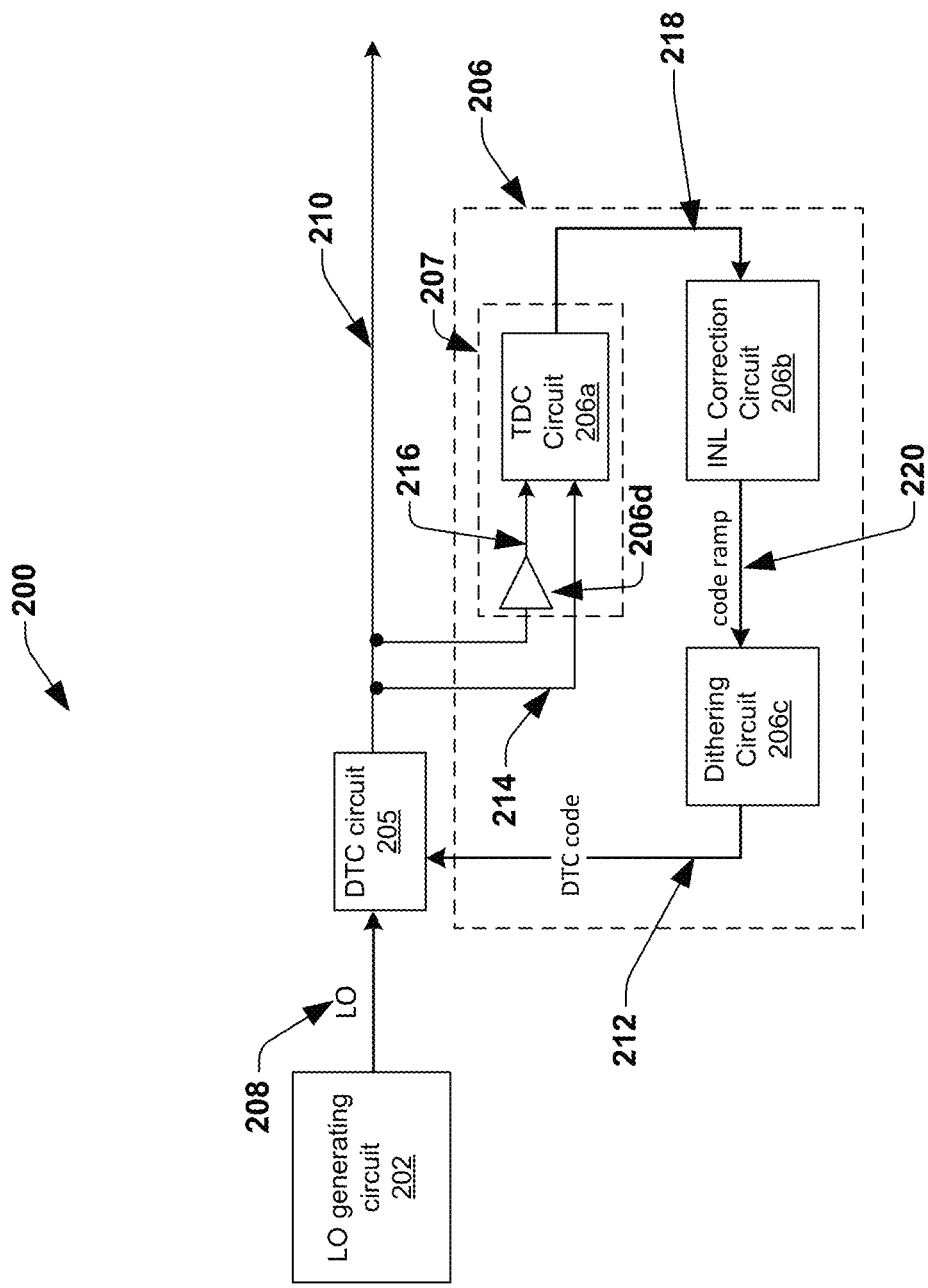
FIG. 2a illustrates an example implementation of a digital to time converter (DTC) system, according to one embodiment of the disclosure.

FIG. 2a illustrates an example implementation of a digital to time converter (DTC) system 200, according to one embodiment of the disclosure. In some embodiments, the DTC system 200 comprises one possible way of implementation of the DTC system 100 in FIG. 1. The DTC system 200 comprises a local oscillator (LO) generating circuit 202 configured to generate a LO signal 208 at a LO frequency $F_{LO}$. In some embodiments, the LO generating circuit 202 comprises a phase locked loop (PLL). The DTC system 200 further comprises a DTC circuit 205 configured to receive the LO signal 208 and generate a DTC output clock signal 210 based thereon, in accordance with a DTC code 212. In some embodiments, the DTC output clock signal 210 comprises a DTC output frequency Fc. In some embodiments, the DTC code 212 comprises a digital code that defines a delay associated with the various edges of the DTC output clock signal 210. In some embodiments, the DTC code 212 is implemented as a DTC code ramp that repeats itself. In some embodiments, the DTC code ramp comprises a set of codes that corresponds respectively to a set of consecutive edges of the DTC output clock signal 210.

In some embodiments, the DTC system 200 further comprises a calibration circuit 206 configured to compensate for the integral nonlinearity (INL) associated with the DTC circuit 205. In some embodiments, the calibration circuit 206 is configured to compensate for the INL by applying a correction to the DTC code 212 based on measuring a time period between consecutive edges of the DTC output clock signal 210. In particular, in some embodiments, the calibration circuit 206 is configured to determine a period error between the consecutive edges, in order to apply the correction to the DTC code 212 (or the DTC code ramp associated therewith), as explained above with respect to FIG. 1. In some embodiments, the period error between two consecutive edges of the DTC output signal 210 comprises a difference in a measured time period between two consecutive edges of the DTC output clock signal 210 from a predefined time period. In some embodiments, the predefined time period comprises a required/expected time period between the two consecutive edges. However, in other embodiments, the predefined time period may be different from above. In some embodiments, the predefined time period is chosen to be close to the required/expected time period, so as to have a small value for the period error.

In some embodiments, the calibration circuit 206 comprises a period error determination circuit 207 configured to determine the period error between consecutive edges of the DTC output clock signal 210. In some embodiments, the period error determination circuit 207 comprises a time to digital converter (TDC) circuit 206a, in order to determine the period error $TDC_{out}$ 218 between two consecutive edges of the DTC output clock signal 210. However, in other embodiments, the period error determination circuit 207 may be implemented differently. In some embodiments, the TDC circuit 206a is configured to determine the period error $TDC_{out}$ 218 between two consecutives edges of the DTC output clock signal 210 based on determining a time difference between a current edge 214 of the DTC output clock signal 210 and a delayed version of a previous edge 216 of the DTC output clock signal 210. In some embodiments, the delay applied to the previous edge is equivalent to the predefined time period discussed above. In some embodiments, the delay is defined by a required time period between the current edge and the previous edge (for example 1/Fc in this embodiment if the two edges comprise consecutive rising edges). However, in other embodiments, the delay provided to the previous edge may be different than above. In some embodiments, the delay is chosen in a way to enable sampling at the TDC circuit 602a without a saturation of the TDC circuit 206a.

In some embodiments, the TDC circuit 206a comprises a small purely stochastic TDC (without delay elements). In some embodiments a small TDC comprises a TDC having a low dynamic range. Accuracy and dynamic range of the TDC circuit 602a depends on the number of flip-flops used. For example, with 16 FF with 2 ps sampling-time-mismatch RMS, the dynamic range will be ~7 ps and the quantization error will be ~0.5 ps. In some embodiments, the period error determination circuit 207 further comprises a delay circuit 206d configured to provide the delay to the edges of the DTC output clock signal 210, prior to providing the respective edges to the TDC circuit 206a. In some embodiments, the delay circuit 206d comprises a configurable delay element. In some embodiments, if the DTC circuit 205 is linear and the delay is chosen to be equal to the required time period between the consecutive edges, the period error $TDC_{out}$ 218 determined at the output of the TDC circuit 206 is zero or a small value to account for the imperfections in the delay provided by the delay circuit 206d. In some embodiments, the quantization errors associated with the TDC circuit 206a may be averaged out by taking multiple samples of period errors.

Figure 2B:
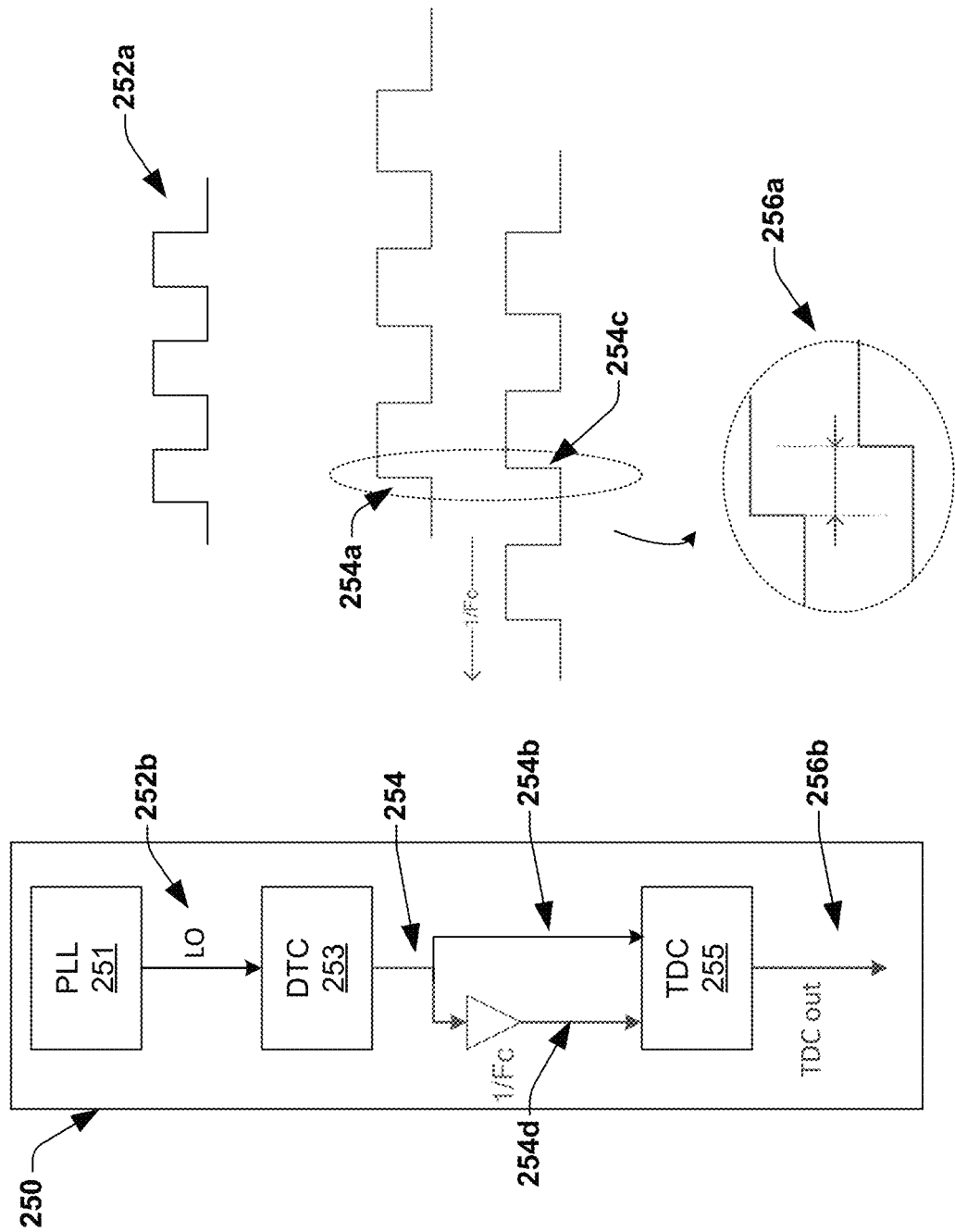
FIG. 2b illustrates the waveforms at the output of the various components of the DTC system, according to one embodiment of the disclosure.

FIG. 2b illustrates the waveforms at the output of the various components of the DTC system 250, according to one embodiment of the disclosure. In some embodiments, the DTC system 250 in FIG. 2b is equivalent to the DTC system 200 in FIG. 2a. In some embodiments, the waveform 252a corresponds to the LO signal 252b at the output of the PLL circuit 251. Further, the signal edge 254a corresponds to a current edge 254b of the DTC output clock signal 254 and the signal edge 254c corresponds to a delayed version of the previous edge 254d of the DTC output clock signal 254. In some embodiments, the previous edge is delayed by an expected/required time period of the DTC output clock signal 254 (for example, 1/Fc in this embodiment). In addition, the block 256a depicts the period error TDC out 256b determined at the TDC circuit 255.

Referring back to FIG. 2a, in some embodiments, the TDC circuit 206a is configured to determine a plurality of period errors $TDC_{out}$ 218 respectively associated with a plurality of consecutive edges of the DTC output clock signal 210, in order to determine the correction to be applied to the DTC code 212. In some embodiments, the calibration circuit 206 further comprises an INL correction circuit 206b configured to store the DTC code 212 associated with the DTC circuit 205 in a memory circuit associated therewith and provide the DTC code 212 to the DTC circuit 205. In some embodiments, the INL correction circuit 206b is further configured to determine a correction to be applied to the DTC code 212 based on a subset of the determined period errors (determined at the TDC circuit 206a). In some embodiments, a number of period errors in the subset of the determined period errors is less than a number of period errors in the plurality of determined period errors (determined at the TDC circuit 206a). In some embodiments, determining the correction to be applied to the DTC code 212 at the INL correction circuit 206b comprises determining that no correction is to be applied to the DTC code 212 when all the period errors in the subset of the determined period errors are equal, and determining a specific correction associated with one or more codes associated with the DTC code 212, when all the period errors in the subset of the determined period errors are not equal. In some embodiments, equal period errors indicate that the time period between the corresponding consecutive edges are equal, which further indicates a zero INL. Therefore, in such embodiments, no correction to the DTC code 212 is required.

Upon determining the correction to be applied to the DTC code 212, in some embodiments, the INL correction circuit 206b is further configured to apply the determined correction to the DTC code 212 stored within the memory circuit and provide the DTC code 212 to the DTC circuit 205. In some embodiments, the output of the INL correction circuit 206b comprises a code ramp 220. In some embodiments, the code ramp 220 at the output of the INL correction circuit 206b may comprise an updated DTC code 212 (when all the period errors in the subset of the determined period errors are not equal), while in other embodiments, the DTC code ramp 220 at the output of the INL correction circuit 206b may comprise the same DTC code 212 as before (when all the period errors in the subset of the determined period errors are equal). In some embodiments, the INL correction circuit 206 is further configured to repeatedly determine the correction to be applied to the DTC code 212 respectively based on repeated subsets of the determined period errors determined at the TDC circuit 206a. In some embodiments, a correction is applied to the DTC code 212 by adjusting one or more codes of the DTC code ramp associated with the DTC code 212 based on the period errors associated with the edges associated with the corresponding one or more codes. Thus, in some embodiments, the DTC code 212 to be provided to the DTC circuit 205 is selectively updated depending on the correction to the DTC code 212 determined within the INL correction circuit 206b during the different repetitions.

In some embodiments, the subset of determined period errors utilized to determine the correction to the DTC code 212 at the INL correction circuit 602b corresponds to a set of period errors respectively associated with a set of consecutive edges corresponding to a set of codes associated with a single DTC code ramp, as explained above with respect to FIG. 1. Alternately, in other embodiments, the subset of determined period errors utilized to determine the correction to the DTC code 212 at the INL correction circuit 602b corresponds to period errors associated with consecutive edges corresponding to multiple set of codes respectively associated with multiple DTC code ramps, as explained above with respect to FIG. 1. In some embodiments, determining the period errors associated with a particular code over multiple code ramps enables to determine an average period error associated with a specific code.

The correction to be applied to the DTC code 212 may be determined differently in different embodiments. For example, in some embodiments, if a single DTC code ramp has 10 codes (e.g., 0, 100, 200 . . . 900) corresponding to 10 consecutive edges of the DTC output signal 110 and if the period error/averaged period error between the edges corresponding to codes 100 and 200 is different from the other 9 period errors/averaged period errors, a correction may be applied to the 100th code or the 200th code, based on the corresponding period error/averaged period error. Alternately, in other embodiments, if the period error/averaged period error between the edges corresponding to codes 100 and 200 is different from the other 9 period errors/averaged period errors, a small correction may be applied to all the codes associated with the DTC code ramp, based on the corresponding period error/averaged period error. However, in other embodiments, the correction to be applied to the DTC code 212 may be determined differently.

Referring back to FIG. 2a, in some embodiments, the calibration circuit 206 further comprises a dithering circuit 206c configured to apply dithering to the code ramp 220 at the output of the INL correction circuit 206b, prior to providing the DTC code 212 to the DTC circuit 205. In some embodiments, the DTC code 212 at the output of the dithering circuit 206c comprises a dithered version of the code ramp 220 at the output of the INL correction circuit 206b. In some embodiments, even with a perfect knowledge of INL, there will still be spurs due to the limited quantization of the DTC circuit 205. In some embodiments, the dithering circuit 206c is configured apply dithering to remove the average error of each code, in order to reduce the spurs. Utilizing the period error, instead of the actual time period between the consecutive edges of the DTC output clock signal 210, in order to calibrate the DTC circuit 205 has many advantages. For example, since the TDC circuit 206a is configured to determine the period error (and not the actual time period between two consecutive edges of the DTC output clock signal 210), a very small TDC with a small dynamic range may be utilized. Further, since the TDC circuit 206a just need to measure the time period between consecutive edges and not the actual time of arrival of the individual edges, the TDC calibration is not required. Further, for the same reason, the delay element need not be calibrated.

Figure 3:
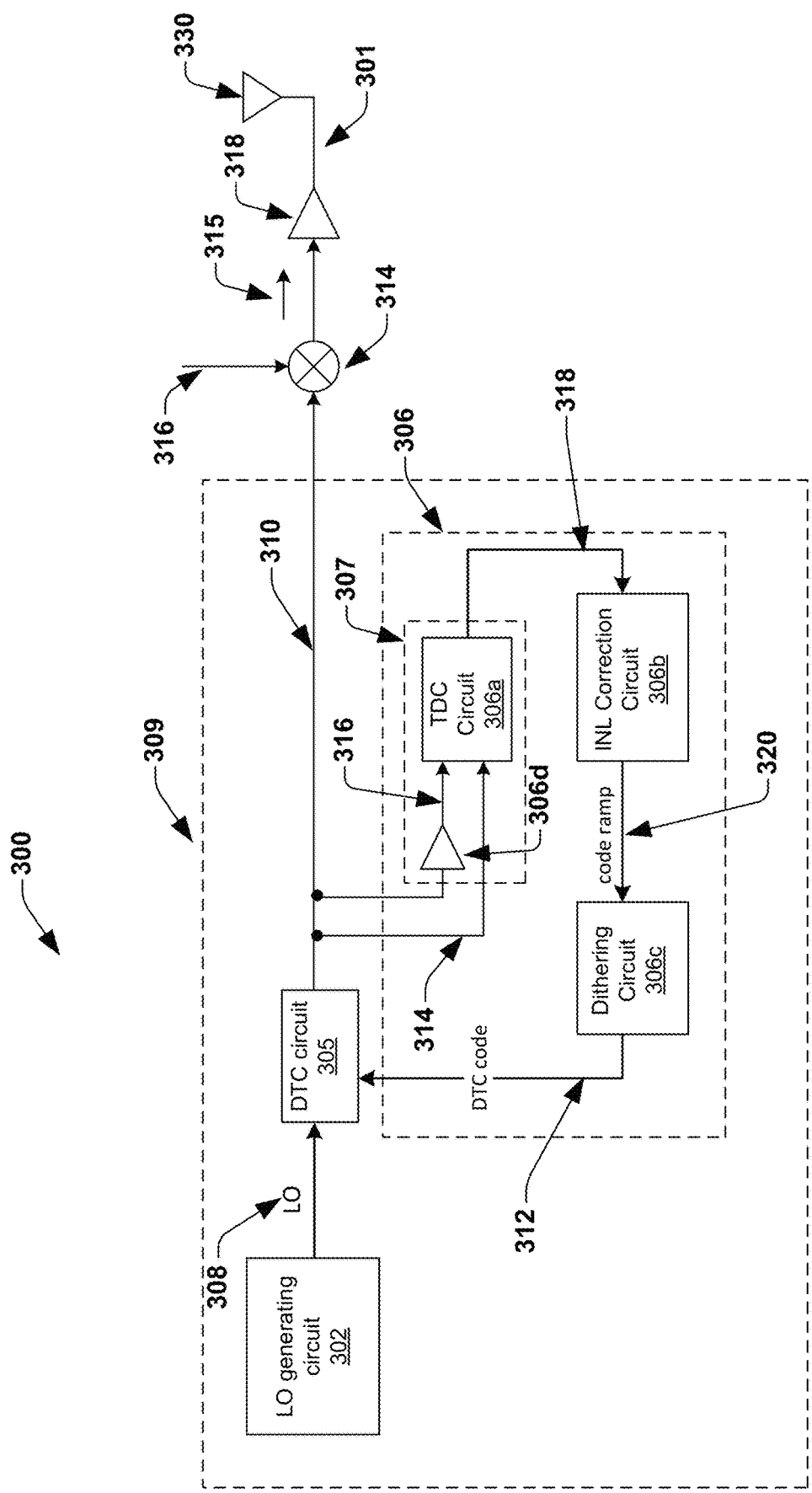
FIG. 3 illustrates a simplified block diagram of a transceiver circuit, according to one embodiments of the disclosure.

FIG. 3 illustrates a simplified block diagram of a transceiver circuit 300, according to one embodiment of the disclosure. In particular, FIG. 3 depicts a simplified block diagram of a transmit path 301 associated with the transceiver circuit 300. In some embodiments, the transmit path 301 is configured to transmit signals from the transceiver circuit 300. In other embodiments, however, the transceiver circuit 300 may also include a receive path to receive signals. In some embodiments, the transceiver circuit 300 can be part of a wireless/wired communication device. In some embodiments, the transmit path 301 is configured to transmit a transmit signal 315 at a transmit frequency. In some embodiments, the transmit signal comprises a radio frequency (RF) signal at RF frequency. In some embodiments, the transmit path 301 comprises a baseband processor (not shown) configured to provide an input signal 316 (or a based band signal) at an input frequency (e.g., baseband frequency). In some embodiments, the transmit path 301 further comprises a mixer circuit 314 configured to upconvert the input signal 316 to form the transmit signal 315 at the transmit frequency. In some embodiments, the mixer circuit 314 is configured to upconvert the input signal 316 based on receiving a digital to time converter (DTC) output clock signal 310. In some embodiments, the DTC output clock signal 310 comprises a clock signal having a DTC output frequency associated therewith.

In some embodiments, the transmit path 301 further comprises a DTC system 309 configured to provide the DTC output clock signal 310. In some embodiments, the DTC system 309 is same as the DTC systems 100 and 200 in FIG. 1 and FIG. 2a, respectively and has all similar functions. In some embodiments, the DTC system 309 comprises a DTC circuit 305 configured to receive a LO signal 308 and generate the DTC output clock signal 310 based on a DTC code 312. In some embodiments, the DTC code 312 comprises a digital code that defines a delay associated with the various edges of the DTC output clock signal 310. In some embodiments, the DTC code 212 is implemented as a DTC code ramp that repeats itself. In some embodiments, the DTC code ramp comprises a set of codes that corresponds respectively to a set of consecutive edges of the DTC output clock signal 310.

In some embodiments, the DTC system 309 further comprises a calibration circuit 306 configured to compensate for the integral nonlinearity (INL) associated with the DTC circuit 305. In some embodiments, the calibration circuit 306 is configured to compensate for the INL by applying a correction to the DTC code 312 based on measuring a plurality of period errors associated with a plurality of consecutive edges of the DTC output clock signal 310, as explained above with respect to FIG. 1 and FIG. 2a. In some embodiments, the calibration circuit 306 comprises a period error determination circuit 307 configured to determine the plurality of period errors $TDC_{out}$ 318 associated with the plurality of consecutive edges of the DTC output clock signal 310. In some embodiments, the period error determination circuit 307 comprises a time to digital converter (TDC) circuit 306a, in order to determine the plurality of period errors $TDC_{out}$ 318 associated with the plurality of consecutive edges of the DTC output clock signal 310. However, in other embodiments, the period error determination circuit 307 may be implemented differently. In some embodiments, the TDC circuit 306a is configured to determine the period error $TDC_{out}$ 318 between two consecutives edges of the DTC output clock signal 310 based on determining a time difference between a current edge of the DTC output clock signal 310 and a delayed version of a previous edge of the DTC output clock signal 310. In some embodiments, the period error determination circuit 307 further comprises a delay circuit 306d configured to provide the delay to the edges of the DTC output clock signal 310, prior to providing the respective edges to the TDC circuit 306a.

In some embodiments, the calibration circuit 306 further comprises an INL correction circuit 306b configured to store the DTC code 312 in a memory circuit associated therewith and provide the DTC code 312 to the DTC circuit 305. In some embodiments, the INL correction circuit 312 is further configured to determine a correction to be applied to the DTC code 312 based on a subset of the determined period errors (determined at the TDC circuit 206a). In some embodiments, a number of period errors in the subset of the determined period errors is less than a number of period errors in the plurality of determined period errors. In some embodiments, determining the correction to be applied to the DTC code 312 at the INL correction circuit 306b comprises determining that no correction is to be applied to the DTC code 312 when all the period errors in the subset of the determined period errors are equal, and determining a specific correction associated with one or more codes associated with the DTC code 312, when all the period errors in the subset of the determined period errors are not equal. Upon determining the correction to be applied to the DTC code 312, in some embodiments, the INL correction circuit 306b is further configured to apply the determined correction to the DTC code 312 stored within the memory circuit and provide the DTC code 312 to the DTC circuit 305. In some embodiments, the output of the INL correction circuit 306b comprises a code ramp 320.

In some embodiments, the code ramp 320 at the output of the INL correction circuit 306b may comprise an updated DTC code 312 (when all the period errors in the subset of the determined period errors are not equal), while in other embodiments, the DTC code ramp 320 at the output of the INL correction circuit 306b may comprise the same DTC code 312 as before (when all the period errors in the subset of the determined period errors are equal). In some embodiments, the INL correction circuit 306b is further configured to repeatedly determine the correction to be applied to the DTC code 312 respectively based on repeated subsets of the determined period errors determined at the TDC circuit 306a. Thus, in some embodiments, the DTC code 312 to be provided to the DTC circuit 305 is selectively updated depending on the correction to the DTC code 312 determined within the INL correction circuit 306b during the different repetitions. In some embodiments, the calibration circuit 306 further comprises a dithering circuit 306c configured to apply dithering to the code ramp 320 at the output of the INL correction circuit 306b, prior to providing the DTC code 312 to the DTC circuit 305. In some embodiments, the DTC code 312 at the output of the dithering circuit 306c comprises a dithered version of the code ramp 320 at the output of the INL correction circuit 306b.

In some embodiments, the transmit path 301 further comprises a LO generating circuit 302 configured to provide the LO signal 308. In some embodiments, the transmit path 301 further comprises a power amplifier circuit 318 configured to amplify the transmit signal 315, prior to transmitting the transmit signal 315 via the antenna 330. In some embodiments, the transmit path 301 may comprise more or less than the components depicted herein. For example, in some embodiments, the transmit path 301 may comprise a low pass filter (not shown) configured to filter the DTC output clock signal 310, prior to providing the DTC output clock signal 310 to the mixer circuit 318.

Figure 4:
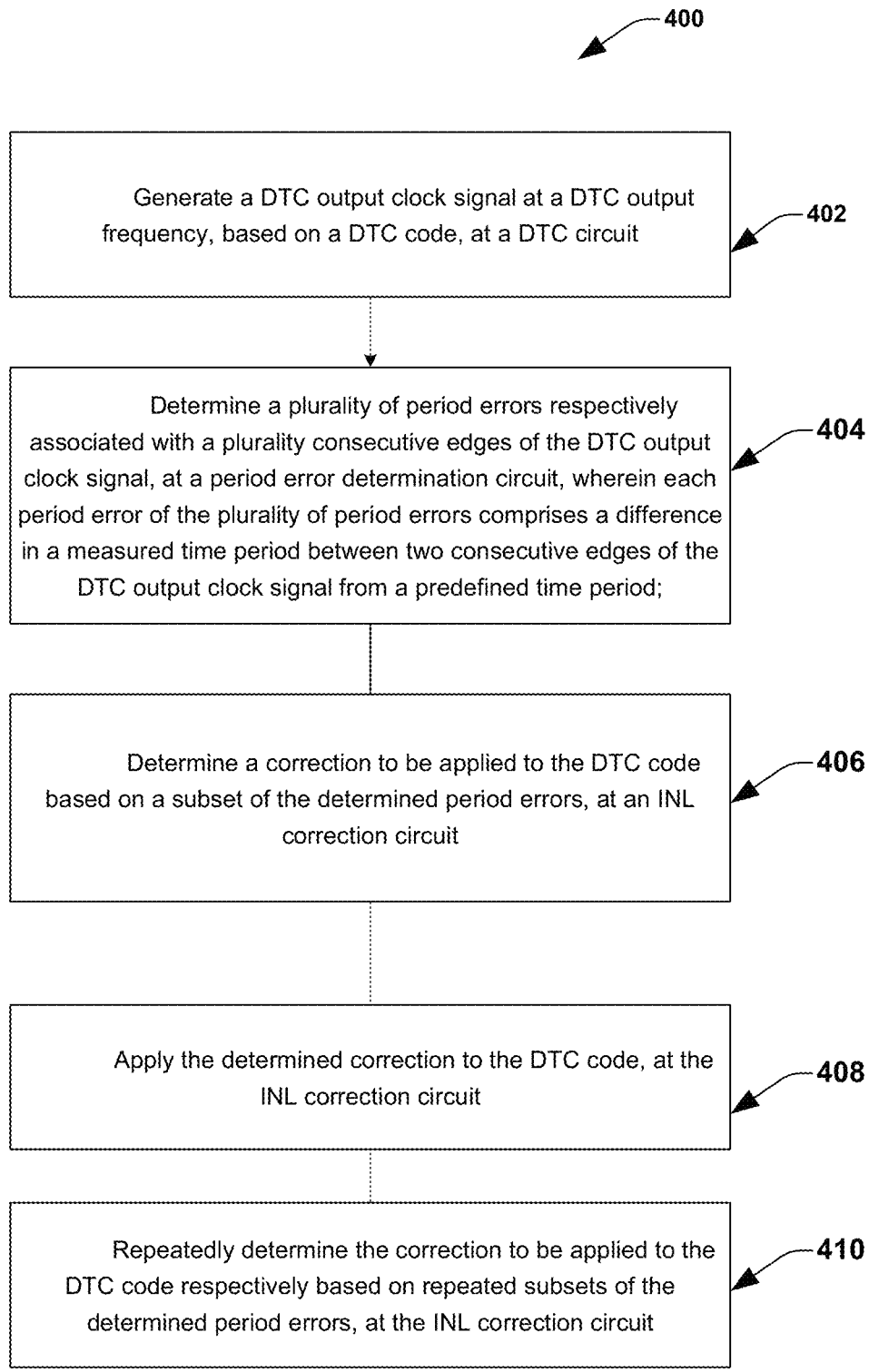
FIG. 4 illustrates a flow chart for a method for calibrating a digital to time converter (DTC) circuit, according to one embodiment of the disclosure.

FIG. 4 illustrates a flow chart for a method 400 for calibrating a digital to time converter (DTC) circuit, according to one embodiment of the disclosure. In some embodiments, the method 400 is applicable to the DTC system 100 in FIG. 1, the DTC system 200 in FIG. 2a and the transceiver circuit 300 in FIG. 3. However, in other embodiments, the method 400 is equally applicable to any DTC system. The method 400 is explained herein with reference to the DTC system 200 in FIG. 2a. At 402, a DTC output clock signal (e.g., the DTC output clock signal 210 in FIG. 2a) at a DTC output frequency is generated at a DTC circuit (e.g., the DTC circuit 205 in FIG. 2a), based on a DTC code (e.g., the DTC code 212 in FIG. 2a). In some embodiments, the DTC output clock signal is generated at the DTC circuit based on receiving a local oscillator signal from a LO generating circuit (e.g., the LO generating circuit 202 in FIG. 2a). In some embodiments, the DTC code comprises a DTC code ramp that repeats itself and the DTC code ramp comprises a set of codes that corresponds respectively to a set of consecutive edges of the DTC output clock signal. In some embodiments, each code defines a delay associated with a respective edge of the DTC output clock signal.

At 404, a plurality of period errors respectively associated with a plurality consecutive edges of the DTC output clock signal are determined at a period error determination circuit (e.g., the period error determination circuit 207 in FIG. 2a). In some embodiments, the period error determination circuit may be part of a calibration circuit of the DTC system. In some embodiments, the plurality of period errors respectively associated with the plurality consecutive edges of the DTC output clock signal are determined at the period error determination circuit, in order to compensate for the integral non-linearity (INL) associated with the DTC circuit. In some embodiments, each period error of the plurality of period errors comprises a difference in a measured time period between two consecutive edges of the DTC output clock signal from a predefined time period. In some embodiments, the predefined time period comprises a required/expected time period between the two consecutive edges of the DTC output clock signal. However, in other embodiments, the predefined time period may be different from above. In some embodiments, the predefined time period is chosen to be close to the required/expected time period, so as to have a small value for the period error.

In some embodiments, the period error determination circuit may comprise a time to digital converter (TDC) circuit (e.g., the TDC circuit 206a in FIG. 2a), in order to determine the plurality of period errors (e.g., the $TDC_{out}$ 218 in FIG. 2a) between the plurality of consecutive edges of the DTC output clock signal. In some embodiments, the TDC circuit is configured to determine the period error between two consecutives edges of the DTC output clock signal based on determining a time difference between a current edge of the DTC output clock signal and a delayed version of a previous edge of the DTC output clock signal, as explained above with respect to FIG. 2a. In some embodiments, the delay applied to the previous edge is equivalent to the predefined time period discussed above. In some embodiments, the delay is defined by a required time period between the current edge and the previous edge (for example 1/Fc if the two edges comprise consecutive rising edges). However, in other embodiments, the delay provided to the previous edge may be different than above. In some embodiments, the delay is chosen in a way to enable sampling at the TDC circuit without a saturation of the TDC circuit.

At 406, a correction to be applied to the DTC code is determined at an INL correction circuit (e.g., the INL correction circuit 206b in FIG. 2a), based on a subset of the determined period errors (determined at the period error determination circuit). In some embodiments, determining the correction to be applied to the DTC code at the INL correction circuit comprises determining that no correction is to be applied to the DTC code when all the period errors in the subset of the determined period errors are equal, and determining a specific correction associated with one or more codes associated with the DTC code, when all the period errors in the subset of the determined period errors are not equal. In some embodiments, equal period errors indicate that the time period between the corresponding consecutive edges are equal, which further indicates a zero INL. In some embodiments, a correction is applied to the DTC code by adjusting one or more codes associated with the DTC code ramp based on the period errors associated with the edges associated with the corresponding one or more codes.

In some embodiments, the subset of determined period errors utilized to determine the correction to the DTC code at the INL correction circuit corresponds to a set of period errors respectively associated with a set of consecutive edges corresponding to a set of codes associated with a single DTC code ramp, as explained above with respect to FIG. 1 and FIG. 2a above. Alternately, in other embodiments, the subset of determined period errors utilized to determine the correction to the DTC code at the INL correction circuit corresponds to period errors associated with consecutive edges corresponding to multiple set of codes respectively associated with multiple DTC code ramps, as explained above with respect to FIG. 1 and FIG. 2a above. In some embodiments, determining the period errors associated with a particular code over multiple code ramps enables to determine an average period error associated with a specific code, which provides a better estimate of the period error.

At 408, the determined correction is applied to the DTC code at the INL correction circuit to form a code ramp (e.g., the code ramp 220 in FIG. 2a) to be applied to the DTC circuit. In some embodiments, the code ramp at the output of the INL correction circuit may comprise an updated DTC code (when all the period errors in the subset of the determined period errors are not equal), while in other embodiments, the code ramp at the output of the INL correction circuit may comprise the same DTC code as before (when all the period errors in the subset of the determined period errors are equal). In some embodiments, the code ramp at the output of the INL correction circuit is further dithered, prior to providing the the DTC code to the DTC circuit. In such embodiments, the DTC system further comprises a dithering circuit (e.g., the dithering circuit 206c in Fig. a) coupled to the INL correction circuit, in order to dither the code ramp at the output of the INL correction circuit. At 410, the correction to be applied to the DTC code is repeatedly determined at the INL correction circuit, respectively based on repeated subsets of the determined period errors.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a digital to time converter (DTC) system, comprising a DTC circuit configured to generate a DTC output clock signal at a DTC output frequency, based on a DTC code; and a calibration circuit comprising a period error determination circuit configured to determine a plurality of period errors respectively associated with a plurality consecutive edges of the DTC output clock signal, wherein each period error of the plurality of period errors comprises a difference in a measured time period between two consecutive edges of the DTC output clock signal from a predefined time period; and an integral non-linearity (INL) correction circuit configured to determine a correction to be applied to the DTC code based on a subset of the determined period errors.

Example 2 is a DC system, including the subject matter of example 1, wherein the period error determination circuit comprises a time to digital converter (TDC) circuit configured to determine the plurality of period errors, wherein each period error is determined at the TDC circuit based on determining a time difference between a current edge of the DTC output clock signal and a delayed version of a previous edge of the DTC output clock signal, wherein the delay applied to the previous edge comprises the predefined time period.

Example 3 is a DC system, including the subject matter of examples 1-2, including or omitting elements, wherein the period error determination circuit further comprises a delay circuit coupled to an input port of the TDC circuit, wherein the delay circuit is configured to delay each edge of the DTC output clock signal entering the TDC input port.

Example 4 is a DC system, including the subject matter of examples 1-3, including or omitting elements, wherein the INL correction circuit is further configured to apply the determined correction to the DTC code.

Example 5 is a DC system, including the subject matter of examples 1-4, including or omitting elements, wherein the calibration circuit further comprises a dithering circuit configured to apply dithering to the DTC code at the output of the INL correction circuit, prior to providing the DTC code to the DTC circuit.

Example 6 is a DC system, including the subject matter of examples 1-5, including or omitting elements, wherein determining the correction to be applied to the DTC code at the INL correction circuit comprises determining that no correction is to be applied to the DTC code, when all period errors associated with the subset of the determined period errors are equal; and determining a specific correction to be applied to the DTC code, when all period errors associated with the subset of the determined period errors are not equal.

Example 7 is a DC system, including the subject matter of examples 1-6, including or omitting elements, wherein the predefined time period comprises an expected time period or a required time period between the consecutive edges of the DTC output clock signal.

Example 8 is a DC system, including the subject matter of examples 1-7, including or omitting elements, wherein the INL correction circuit is further configured to repeatedly determine the correction to be applied to the DTC code respectively based on repeated subsets of the determined period errors.

Example 9 is a DC system, including the subject matter of examples 1-8, including or omitting elements, wherein the DTC code comprises a DTC code ramp that repeats itself and wherein the DTC code ramp comprises a set of codes that corresponds respectively to a set of consecutive edges of the DTC output clock signal.

Example 10 is a DC system, including the subject matter of examples 1-9, including or omitting elements, wherein the correction is applied to the DTC code by adjusting one or more codes associated with the DTC code ramp based on the period errors associated with the edges associated with the corresponding one or more codes.

Example 11 is a DC system, including the subject matter of examples 1-10, including or omitting elements, wherein the subset of determined period errors corresponds to a set of period errors respectively associated with a set of consecutive edges corresponding to a set of codes associated with a single DTC code ramp.

Example 12 is a DC system, including the subject matter of examples 1-11, including or omitting elements, wherein the subset of determined period errors corresponds to period errors associated with consecutive edges corresponding to multiple set of codes respectively associated with multiple DTC code ramps.

Example 13 is a DC system, including the subject matter of examples 1-12, including or omitting elements, wherein a number of period errors in the subset of the determined period errors is less than a number of period errors in the plurality of determined period errors.

Example 14 is a DC system, including the subject matter of examples 1-13, including or omitting elements, wherein the TDC circuit comprises a stochastic TDC.

Example 15 is a DC system, including the subject matter of examples 1-14, including or omitting elements, further comprises a phase locked loop (PLL) circuit configured to provide a local oscillator signal to the DTC circuit, in order to enable the DTC circuit to generate the DTC output clock signal.

Example 16 is a method for a digital to time converter (DTC) system, comprising generating a DTC output clock signal at a DTC output frequency, based on a DTC code, at a DTC circuit; determining a plurality of period errors respectively associated with a plurality consecutive edges of the DTC output clock signal, at a period error determination circuit, wherein each period error of the plurality of period errors comprises a difference in a measured time period between two consecutive edges of the DTC output clock signal from a predefined time period; determining a correction to be applied to the DTC code based on a subset of the determined period errors, at an integral non-linearity (INL) correction circuit; and applying the determined correction to the DTC code, at the INL correction circuit.

Example 17 is a method, including the subject matter of example 16, wherein determining the plurality of period errors respectively associated with the plurality consecutive edges of the DTC output clock signal comprises determining each period error of the plurality of period errors, at a time to digital converter (TDC) circuit comprising the period error determination circuit, based on determining a time difference between a current edge of the DTC output clock signal and a delayed version of a previous edge of the DTC output clock signal, wherein the delay applied to the previous edge comprises the predefined time period.

Example 18 is a method, including the subject matter of examples 16-17, including or omitting elements, further comprising repeatedly determining the correction to be applied to the DTC code respectively based on repeated subsets of the determined period errors, at the INL correction circuit.

Example 19 is a method, including the subject matter of examples 16-18, including or omitting elements, wherein determining the correction to be applied to the DTC code at the INL correction circuit comprises determining that no correction is to be applied to the DTC code, when all period errors associated with the subset of the determined period errors are equal; and determining a specific correction to be applied to the DTC code, when all period errors associated with the subset of the determined period errors are not equal.

Example 20 is a method, including the subject matter of examples 16-19, including or omitting elements, wherein the predefined time period comprises an expected time period or a required time period between the consecutive edges of the DTC output clock signal.

Example 21 is a method, including the subject matter of examples 16-20, including or omitting elements, wherein the DTC code comprises a DTC code ramp that repeats itself and wherein the DTC code ramp comprises a set of codes that corresponds respectively to a set of consecutive edges of the DTC output clock signal.

Example 22 is a method, including the subject matter of examples 16-21, including or omitting elements, wherein the correction is applied to the DTC code by adjusting one or more codes associated with the DTC code ramp based on the period errors associated with the edges associated with the corresponding one or more codes.

Example 23 is a transceiver circuit, comprising a transmit path configured to provide a transmit signal at a transmit frequency for subsequent transmission, the transmit path comprising a mixer circuit configured to upconvert an input signal to the transmit signal at the transmit frequency, based on a digital to time converter (DTC) output clock signal; and a DTC circuit coupled to the mixer circuit and configured to generate the DTC output clock signal at a DTC output frequency, based on a DTC code; and a calibration circuit, comprising a period error determination circuit configured to determine a plurality of period errors respectively associated with a plurality consecutive edges of the DTC output clock signal, wherein each period error of the plurality of period errors comprises a difference in a measured time period between two consecutive edges of the DTC output clock signal from a predefined time period; and an integral non-linearity (INL) correction circuit configured to determine a correction to be applied to the DTC code based on a subset of the determined period errors.

Example 24 is a transceiver circuit, including the subject matter of example 23, further comprising a phase locked loop (PLL) circuit coupled to the DTC circuit, wherein the PLL circuit is configured to generate a local oscillator (LO) signal at a LO frequency, in order to enable the DTC circuit to generate the DTC output clock signal.

Example 25 is a transceiver circuit, including the subject matter of examples 23-24, including or omitting elements, wherein the period error determination circuit comprises a time to digital converter (TDC) circuit configured to determine the plurality of period errors, wherein each period error is determined at the TDC circuit based on determining a time difference between a current edge of the DTC output clock signal and a delayed version of a previous edge of the DTC output clock signal, wherein the delay applied to the previous edge comprises the predefined period.

Example 26 is a transceiver circuit, including the subject matter of examples 23-25, including or omitting elements, wherein determining the correction to be applied to the DTC code at the INL correction circuit comprises determining that no correction is to be applied to the DTC code, when all period errors associated with the subset of the determined period errors are equal; and determining a specific correction to be applied to the DTC code, when all period errors associated with the subset of the determined period errors are not equal.

Example 27 is a transceiver circuit, including the subject matter of examples 23-26, including or omitting elements, wherein the INL correction circuit is further configured to repeatedly determine the correction to be applied to the DTC code respectively based on repeated subsets of the determined period errors.

Example 28 is a transceiver circuit, including the subject matter of examples 23-27, including or omitting elements, wherein the predefined time period comprises an expected time period or a required time period between the consecutive edges of the DTC output clock signal.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A digital to time converter (DTC) system, comprising:
  a DTC circuit configured to generate a DTC output clock signal at a DTC output frequency, based on a DTC code; and
  a calibration circuit comprising:
    a period error determination circuit configured to determine a period error associated with successive edges of the DTC output clock signal, wherein the period error comprises a time period between a current edge of the DTC output clock signal and a delayed version of a previous edge of the DTC output clock signal; and
    a correction circuit configured to determine a correction to be applied to the DTC code based on the determined period error.

2. The DTC system of claim 1, wherein the period error determination circuit is configured to determine a plurality of period errors associated with a plurality of successive edges of the DTC output clock signal.

3. The DTC system of claim 2, wherein the correction circuit is configured to determine the correction based on the plurality of period errors, or a subset of the plurality of period errors.

4. The DTC system of claim 1, wherein the period error determination circuit comprises:
  a time to digital converter (TDC) circuit configured to determine the period error, wherein the period error is determined at the TDC circuit based on a determination of a time difference between the current edge of the DTC output clock signal and the delayed version of the previous edge of the DTC output clock signal.

5. The DTC system of claim 4, wherein the period error determination circuit further comprises a delay circuit coupled to an input port of the TDC circuit, wherein the delay circuit is configured to delay each edge of the DTC output clock signal entering the TDC input port.

6. The DTC system of claim 1, wherein the correction circuit is further configured to apply the determined correction to the DTC code.

7. The DTC system of claim 6, wherein the calibration circuit further comprises a dithering circuit configured to apply dithering to the DTC code at the output of the correction circuit, prior to providing the DTC code to the DTC circuit.

8. The DTC system of claim 3, wherein the correction circuit is further configured to:
  determine that no correction is to be applied to the DTC code, when all period errors associated with the plurality or a subset of the plurality of determined period errors are equal; and
  determine a specific correction to be applied to the DTC code, when all period errors associated with the plurality or a subset of the plurality of determined period errors are not equal.

9. The DTC system of claim 3, wherein the correction circuit is further configured to repeatedly determine the correction to be applied to the DTC code respectively based on repeated subsets of the plurality of period errors.

10. The DTC system of claim 1, further comprising a phase locked loop (PLL) circuit configured to provide a local oscillator signal to the DTC circuit, in order to enable the DTC circuit to generate the DTC output clock signal.

11. A method for calibrating a digital to time converter (DTC) system, comprising:

generating a DTC output clock signal having a DTC output frequency using a DTC circuit based on a DTC code input thereto;

determining a period error associated with successive edges of the DTC output clock signal using a period error determination circuit, wherein determining the period error associated with the successive edges of the DTC output clock signal comprises determining the period error based on a time difference between a current edge of the DTC output clock signal and a delayed version of a previous edge of the DTC output clock signal;

determining a correction to be applied to the DTC code based on the determined period error using a correction circuit; and applying the determined correction to the DTC code.

12. The method of claim 11, wherein:

determining the period error comprises determining a plurality of period errors associated with a plurality of successive edges of the DTC output clock signal, respectively; and determining the correction comprises determining the correction based on the plurality of period errors or a subset of the plurality of period errors.

13. The method of claim 12, wherein determining the correction to be applied to the DTC code at the correction circuit comprises:

determining that no correction is to be applied to the DTC code, when all period errors associated with the plurality or the subset of the plurality of period errors are equal; and determining a specific correction to be applied to the DTC code, when all period errors associated with the plurality or the subset of the plurality of period errors are not equal.

14. A transceiver circuit, comprising:

a transmit path configured to provide a transmit signal at a transmit frequency for subsequent transmission, the transmit path comprising:

a mixer circuit configured to upconvert an input signal to the transmit signal at the transmit frequency, based on a digital to time converter (DTC) output clock signal; and a DTC circuit coupled to the mixer circuit and configured to generate the DTC output clock signal at a DTC output frequency, based on a DTC code; and a calibration circuit, comprising:

a period error determination circuit configured to determine a period error associated with successive edges of the DTC output clock signal; and a correction circuit configured to determine a correction to be applied to the DTC code based on the determined period error.

15. The transceiver circuit of claim 14, wherein the period error determination circuit is configured to determine a plurality of period errors associated with a plurality of successive edges of the DTC output clock signal.

16. The transceiver circuit of claim 15, wherein the correction circuit is configured to determine the correction based on the plurality of period errors, or a subset of the plurality of period errors.

17. The transceiver circuit of claim 16, wherein the correction circuit is further configured to:

determine that no correction is to be applied to the DTC code, when all period errors associated with the plurality or the subset of the plurality of period errors are equal; and determine a specific correction to be applied to the DTC code, when all period errors associated with the plurality or the subset of the plurality of period errors are not equal.

18. The transceiver circuit of claim 14, wherein the period error determination circuit comprises:

a time to digital converter (TDC) circuit configured to determine the period error based on a time difference between a current edge of the DTC output clock signal and a delayed version of a previous edge of the DTC output clock signal.

* * * * *